US012269970B2

(12) United States Patent
Yoshizaki et al.

(10) Patent No.: US 12,269,970 B2
(45) Date of Patent: Apr. 8, 2025

(54) POLISHING COMPOSITION, POLISHING METHOD AND METHOD FOR PRODUCING SEMICONDUCTOR SUBSTRATE

(71) Applicant: FUJIMI INCORPORATED, Kiyosu (JP)

(72) Inventors: Yukinobu Yoshizaki, Kiyosu (JP); Hirofumi Ikawa, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 391 days.

(21) Appl. No.: 17/698,962

(22) Filed: Mar. 18, 2022

(65) Prior Publication Data

US 2022/0298380 A1 Sep. 22, 2022

(30) Foreign Application Priority Data

Mar. 19, 2021 (JP) ................. 2021-045750

(51) Int. Cl.
*C09G 1/02* (2006.01)
*H01L 21/304* (2006.01)

(52) U.S. Cl.
CPC .............. *C09G 1/02* (2013.01); *H01L 21/304* (2013.01)

(58) Field of Classification Search
CPC ..... C09G 1/02; H01L 21/304; H01L 21/3212; H01L 21/31053; H01L 21/30625; C09K 3/1436; C09K 3/1463
See application file for complete search history.

(56) References Cited

U.S. PATENT DOCUMENTS

| | | | | |
|---|---|---|---|---|
| 2003/0209522 A1* | 11/2003 | Grumbine | ............ | C09K 3/1454 216/88 |
| 2004/0077768 A1* | 4/2004 | Greenwood | ........... | C09D 5/028 524/492 |
| 2007/0077764 A1 | 4/2007 | Shimizu | | |
| 2010/0181525 A1* | 7/2010 | Belmont | ............... | C09K 3/1436 252/79.1 |
| 2012/0156874 A1* | 6/2012 | Han | ..................... | C09K 3/1463 252/79.4 |
| 2014/0094033 A1* | 4/2014 | Yamato | ............... | H01L 21/3212 438/693 |
| 2015/0259573 A1* | 9/2015 | Grumbine | ......... | H01L 21/30625 438/693 |
| 2015/0376461 A1* | 12/2015 | Grumbine | ............. | B24B 37/044 252/79.1 |
| 2017/0175053 A1* | 6/2017 | Yokota | .................... | C23G 5/028 |
| 2018/0327648 A1* | 11/2018 | Bataweel | ................ | C04B 28/24 |
| 2019/0080927 A1* | 3/2019 | Izawa | ................ | H01L 21/3212 |
| 2019/0233678 A1* | 8/2019 | Taguchi | ................ | H01L 21/304 |

FOREIGN PATENT DOCUMENTS

| | | | | |
|---|---|---|---|---|
| JP | 2007-103515 A | | 4/2007 | |
| JP | 2007273910 A | * | 10/2007 | ............... C09G 1/02 |
| JP | 2020025066 A | * | 2/2020 | ............... C09G 1/02 |

OTHER PUBLICATIONS

JP-2020025066-A, Machine Translation (Year: 2024).*
JP-2007273910-A, Machine Translation. (Year: 2024).*

* cited by examiner

*Primary Examiner* — Duy Vu N Deo
*Assistant Examiner* — Christopher Remavege
(74) *Attorney, Agent, or Firm* — Foley & Lardner LLP

(57) ABSTRACT

Provided is a polishing composition capable of polishing a layer containing an element in group 13 of the periodic table in a content of 40 mass % or more at a high polishing speed. Provided is a polishing composition for use in polishing an object to be polished having a layer containing an element in group 13 of the periodic table in a content of 40 mass % or more, the polishing composition containing a cationically modified silica, a polyalkylene glycol, and an acid.

12 Claims, No Drawings

POLISHING COMPOSITION, POLISHING METHOD AND METHOD FOR PRODUCING SEMICONDUCTOR SUBSTRATE

CROSS-REFERENCE TO RELATED APPLICATION

The entire disclosure of Japanese Patent Application No. 2021-45750, filed on Mar. 19, 2021, is incorporated herein by reference in its entirety.

TECHNICAL FIELD

The present invention relates to a polishing composition, a polishing method, and a method for producing a semiconductor substrate.

BACKGROUND ART

In recent years, a so-called chemical mechanical polishing (CMP) technique for polishing and flattening a semiconductor substrate in producing a device is used in accordance with multilayer wiring on a surface of a semiconductor substrate. CMP is a method for flattening a surface of an object to be polished (polishing object) such as a semiconductor substrate using a polishing composition (slurry) containing abrasive grains such as silica, alumina, or ceria, an anti-corrosion agent, a surfactant, or the like. The object to be polished (polishing object) is silicon, polysilicon, a silicon oxide film (silicon oxide), silicon nitride, a wiring or a plug which consists of metal, or the like.

For example, as a technique for polishing a polysilicon film provided on a silicon substrate including an isolation region, Japanese Patent Laid-Open No. 2007-103515 (corresponding to U.S. Patent Application No. 2007/0077764) discloses a polishing method including a step of performing preliminarily polishing using a preliminary polishing composition containing abrasive grains, an alkali, a water-soluble polymer and water, and a step of performing finish polishing using a finish polishing composition containing abrasive grains, an alkali, a water-soluble polymer and water.

SUMMARY OF INVENTION

Technical Problem

The recent use of a substrate having a layer containing an element in group 13 of the periodic table in a content of 40 mass % or more as a semiconductor substrate leads to a new requirement of polishing the substrate. Such requirement has almost never been examined.

Therefore, an object of the present invention is to provide a polishing composition capable of polishing a layer containing an element in group 13 of the periodic table in a content of 40 mass % or more at a high polishing speed.

Another object of the present invention is to provide a polishing composition with which the polishing speed for polishing a layer containing an element in group 13 of the periodic table in a content of 40 mass % or more is higher than the polishing speed for polishing other materials (specifically, the selection ratio is high).

Solution to Problem

The inventors of the present invention have intensively studied to solve the above new problems. As a result, the inventors have discovered that the above problems can be solved by a polishing composition containing a cationically modified silica, a polyalkylene glycol and an acid, and thus have completed the present invention.

Specifically, the present invention is a polishing composition for use in polishing an object to be polished having a layer having a content of a group 13 element of 40 mass % or more, the polishing composition containing a cationically modified silica, a polyalkylene glycol, and an acid.

DESCRIPTION OF EMBODIMENTS

The present invention is a polishing composition for use in polishing an object to be polished having a layer containing an element in group 13 of the periodic table in a content of 40 mass % or more, the polishing composition containing a cationically modified silica, a polyalkylene glycol, and an acid. The polishing composition according to an embodiment of the present invention having such a configuration is capable of polishing a layer containing an element in group 13 of the periodic table in a content of 40 mass % or more at a high polishing speed. Further, the polishing composition according to another embodiment of the present invention exhibits higher polishing speed for a layer containing an element in group 13 of the periodic table in a content of 40 mass % or more than the polishing speed for other materials (Specifically, selection ratio is high).

Embodiments of the present invention will be described below, but the present invention is not limited to only the following embodiments. Throughout the present specification, unless particularly stated otherwise, any expression in a singular form should be understood to encompass the concept of its plural form. Therefore, unless particularly stated otherwise, the article specifying a single form (for example, "a", "an", "the", and the like in the case of English language) should be understood to encompass the concept of its plural form. Furthermore, unless particularly stated otherwise, any term used in the present specification should be understood as a term that is used to have the meaning conventionally used in the relevant technical field. Therefore, unless defined otherwise, all the technical terms and scientific terms used in the present specification have the same meaning as generally understood by a person ordinarily skilled in the art to which the present invention is pertained. If there is any conflict in meaning, the present specification (including the definitions) takes priority.

In this specification, unless otherwise specified, operation and measurement of physical properties, etc., are performed under conditions of room temperature (20° C. or higher and 25° C. or lower)/relative humidity of 40% RH or more and 50% RH or less.

[Object to be Polished]

The object to be polished according to the present invention has a layer containing an element in group 13 of the periodic table in a content of 40 mass % or more (hereinafter, also simply referred to as a group 13 element layer). Examples of a group 13 element include boron (B), aluminum (Al), gallium (Ga) and indium (In). These group 13 elements may be contained singly or in combinations of two or more thereof.

The group 13 element layer may also contain other elements other than group 13 elements. Examples of other elements include silicon (Si), hydrogen (H), nitrogen (N), oxygen (O), carbon (C), phosphorus (P) and germanium (Ge). These other elements may be contained singly or in combinations of two or more thereof.

The lower limit of a group 13 element contained in the group 13 element layer is 40 mass % or more, preferably 45 mass % or more, more preferably 47 mass % or more, and further preferably 50 mass % or more with respect to the total mass of the layer. Further, the upper limit of a group 13 element contained in the group 13 element layer is preferably 100 mass % or less, more preferably 95 mass % or less, and further preferably 90 mass % or less with respect to the total mass of the layer.

The object to be polished according to the present invention may further contain other materials other than the group 13 element layer. Examples of other materials include silicon nitride, silicon carbonitride (SiCN), silicon oxide, polycrystalline silicon (polysilicon), non-crystalline silicon (amorphous silicon), polycrystalline silicon doped with an n-type impurity, non-crystalline silicon doped with an n-type impurity, titanium nitride, a simple substance of metal, and SiGe.

Examples of an object to be polished containing silicon oxide include a TEOS (Tetraethyl Orthosilicate)-type silicon oxide plane (hereinafter, may also be referred to as "TEOS" or "TEOS film") that is formed using tetraethyl orthosilicate as a precursor, an HDP (High Density Plasma) film, an USG (Undoped Silicate Glass) film, a PSG (Phosphorus Silicate Glass) film, a BPSG (Boron-Phospho Silicate Glass) film, and an RTO (Rapid Thermal Oxidation) film.

Examples of a simple substance of metal include tungsten, copper, cobalt, hafnium, nickel, gold, silver, platinum, palladium, rhodium, ruthenium, iridium, and osmium.

Moreover, the object to be polished according to the present invention may further contain a material having an element in group 13 of the periodic table in a content of more than 0 mass % and less than 40 mass %. Examples of such a material include polycrystalline silicon doped with a p-type impurity and non-crystalline silicon doped with a p-type impurity.

[Cationically Modified Silica]

The polishing composition according to the present invention contains cationically modified silica (silica having cationic groups) as abrasive grains. One cationically modified silica may be used, or two or more thereof may be used in combination. Further, commercial products or synthetic products of cationically modified silica may also be used.

As the cationically modified silica, cationically modified colloidal silica (colloidal silica having cationic group) is preferable.

Examples of a method for producing colloidal silica include a soda silicate method and a sol-gel method, and any colloidal silica produced by any of these methods is suitably used as abrasive grains according to the present invention. However, from the viewpoint of reducing metal impurities, colloidal silica produced by a sol-gel method is preferable, since such colloidal silica produced by a sol-gel method has a low content of metal impurities diffusible in a semiconductor and corrosive ions such as chloride ions. Production of colloidal silica by such a sol-gel method can be performed by a conventionally known technique. Specifically, hydrolysis and condensation reaction are performed using a hydrolysable silicon compound (for example, alkoxysilane or a derivative thereof) as a raw material, so that colloidal silica can be obtained.

Here, the term "cationically modified" means a state in which a cationic group (for example, an amino group or a quaternary ammonium group) is bound to a surface of silica (preferably colloidal silica). Further, according to a preferred embodiment of the present invention, cationically modified silica particles are amino group-modified silica particles, and more preferably amino group-modified colloidal silica particles. According to such an embodiment, the above effect can be even more improved.

Silica (colloidal silica) is cationically modified by adding a silane coupling agent having a cationic group (for example, an amino group or a quaternary ammonium group) to silica (colloidal silica) for reaction at a predetermined temperature for a predetermined time period. In a preferred embodiment of the present invention, a cationically modified silica is prepared by fixing a silane coupling agent having an amino group or a silane coupling agent having a quaternary ammonium group onto the surface of silica (more preferably colloidal silica).

Examples of a silane coupling agent to be used in such a case include those described in Japanese Patent Laid-Open No. 2005-162533. Specific examples thereof include silane coupling agents such as N-(β-aminoethyl)-γ-aminopropylmethyldimethoxysilane, N-(β-aminoethyl)-γ-aminopropyltrimethoxysilane, N-(β-aminoethyl)-γ-aminopropyltriethoxysilane, γ-aminopropyltriethoxysilane((3-aminopropyl)triethoxysilane), γ-aminopropyltrimethoxysilane, γ-triethoxysilyl-N-(α,γ-dimethyl-butylidene)propylamine, N-phenyl-γ-aminopropyltrimethoxysilane, a hydrochloride of N-(vinylbenzyl)-β-aminoethyl-γ-aminopropyltriethoxysilane, octadecyldimethyl-(γ-trimethoxysilylpropyl)-ammonium chloride, and N-trimethoxysilylpropyl-N,N,N-trimethylammonium chloride. Of these, because of good reactivity with colloidal silica, N-(β-aminoethyl)-γ-aminopropyltrimethoxysilane, N-(β-aminoethyl)-γ-aminopropyltriethoxysilane, γ-aminopropyltriethoxysilane, and γ-aminopropyltrimethoxysilane are preferably used. Note that in the present invention, one silane coupling agent may be used, or two or more thereof may be used in combination.

In addition, a silane coupling agent can be directly added to or diluted with a hydrophilic organic solvent or pure water and then added to silica (colloidal silica). Through dilution with a hydrophilic organic solvent or pure water, generation of aggregates can be suppressed. When a silane coupling agent is diluted with a hydrophilic organic solvent or pure water, the silane coupling agent may be diluted with a hydrophilic organic solvent or pure water in such a manner that the concentration of the silane coupling agent is about preferably 0.01 g or more and 1 g or less, and more preferably 0.1 g or more and 0.7 g or less in 1 L of the hydrophilic organic solvent or pure water. Examples of the hydrophilic organic solvent can include, but are not particularly limited to, lower alcohols such as methanol, ethanol, isopropanol, and butanol.

Further, through regulation of the amount of a silane coupling agent added, the amount of a cationic group to be introduced onto the surface of silica (colloidal silica) can be regulated. The amount of a silane coupling agent to be used is not particularly limited and is about preferably 0.1 mM (mmol/L) or more and 5 mM or less, and more preferably 0.5 mM or more and 3 mM or less with respect to the amount of a reaction solution.

Temperatures at which silica (colloidal silica) is cationically modified with a silane coupling agent are not particularly limited and may range from room temperature (e.g., 25° C.) to about the boiling point of a dispersing medium in which silica (colloidal silica) is dispersed. Specifically, the temperature is about 0° C. or higher and 100° C. or lower, and preferably room temperature (e.g., 25° C.) or higher and 90° C. or lower.

The shape of cationically modified silica is not particularly limited and may be globular (hereinafter, also referred to as spherical), or non-globular. Specific examples of a non-globular shape include various shapes, but are not particularly limited to, polygonal columnar shapes such as a triangle pole and a square pole, cylindrical shapes, a straw bag shape in which the center part of the cylinder is swollen more than the end parts, a donut shape in which the center part of the disk is hollow, a plate shape, a so-called cocoon shape having a constriction at the center part, a so-called associated type spherical shape in which a plurality of particles are integrated, a so-called kompeito shape having a plurality of protrusions on the surface; and a rugby ball shape.

The average primary particle size of the cationically modified silica is preferably 1 nm or more, more preferably 3 nm or more, and further preferably 5 nm or more. As the average primary particle size of the cationically modified silica increases, the polishing speed for the group 13 element layer is more improved. Further, the average primary particle size of the cationically modified silica is preferably 100 nm or less, more preferably 50 nm or less, and further preferably 30 nm or less. As the average primary particle size of the cationically modified silica decreases, the polishing speed for the group 13 element layer becomes higher than the polishing speed for other materials (selection ratio is more increased).

Specifically, the average primary particle size of the cationically modified silica is preferably 1 nm or more and 100 nm or less, more preferably 3 nm or more and 50 nm or less, and further preferably 5 nm or more and 30 nm or less. Note that the average primary particle size of the cationically modified silica can be calculated on the basis of the specific surface area (SA) of cationically modified silica, as calculated by a BET method, and the density of the cationically modified silica, for example. More specifically, as the average primary particle size of the cationically modified silica, a value measured by a method described in Examples is employed.

Further, the average secondary particle size of the cationically modified silica is preferably 15 nm or more, more preferably 20 nm or more, and further preferably 25 nm or more. As the average secondary particle size of the cationically modified silica increases, resistance during polishing decreases to enable stable polishing. Further, the average secondary particle size of the cationically modified silica is preferably 200 nm or less, more preferably 150 nm or less, and further preferably 100 nm or less. As the average secondary particle size of the cationically modified silica decreases, the surface area per unit mass of the cationically modified silica increases, the frequency of contact with an object to be polished is improved, and the polishing speed is more improved. Specifically, the average secondary particle size of the cationically modified silica is preferably 15 nm or more and 200 nm or less, more preferably 20 nm or more and 150 nm or less, and further preferably 25 nm or more and 100 nm or less. Note that as the average secondary particle size of the cationically modified silica, a value measured by a method described in Examples is employed.

The ratio of the average secondary particle size to the average primary particle size of the cationically modified silica (average secondary particle size/average primary particle size, hereinafter, also referred to as "average degree of association") is preferably more than 1.0, more preferably 1.1 or more, and further preferably 1.2 or more. As the average degree of association of the cationically modified silica increases, the polishing speed for the group 13 element layer is more improved. Further, the average degree of association of the cationically modified silica is preferably 4 or less, more preferably 3.5 or less, and further preferably 3 or less. As the average degree of association of the cationically modified silica decreases, the polishing speed for the group 13 element layer becomes higher than the polishing speed for other materials (selection ratio is more increased). Specifically, the average degree of association of the cationically modified silica is preferably more than 1.0 and 4 or less, more preferably 1.1 or more and 3.5 or less, and further preferably 1.2 or more and 3 or less.

Note that the average degree of association of the cationically modified silica is obtained by dividing the value of the average secondary particle size of the cationically modified silica by the value of the average primary particle size of the cationically modified silica.

The upper limit of the aspect ratio of the cationically modified silica in a polishing composition is not particularly limited, but is preferably less than 2.0, more preferably 1.8 or less, and further preferably 1.5 or less. With the upper limit within such ranges, defects on a surface of an object to be polished can be even more reduced. Note that the aspect ratio is an average value of values, each of which is obtained by dividing the length of the long side of a rectangle by the length of a short side of the rectangle, where the rectangle is the minimum rectangle circumscribing each image of cationically modified silica particles obtained by the use of a scanning electron microscope. The aspect ratio can be found using a general image analysis software. The lower limit of the aspect ratio of the cationically modified silica in a polishing composition is not particularly limited, but is preferably 1.0 or more.

In the particle size distribution determined by subjecting the cationically modified silica to a laser diffraction/scattering method, the lower limit of D90/D50 that is the ratio of particle diameter (D90) when the weight of accumulated particles from the particulate side reaches 90% of the total weight of particles to particle diameter (D50) when the same reaches 50% of the total weight of particles is not particularly limited, but is preferably 1.1 or more, more preferably 1.2 or more, and further preferably 1.3 or more. Further, in the particle size distribution determined by subjecting the cationically modified silica in a polishing composition to a laser diffraction/scattering method, the upper limit of D90/D50 that is the ratio of particle diameter (D90) when the weight of accumulated particles from the particulate side reaches 90% of the total weight of particles to particle diameter (D50) when the same reaches 50% of the total weight of particles is not particularly limited, but is preferably 2.0 or less, more preferably 1.7 or less, and further preferably 1.5 or less. With the limits within such ranges, defects on a surface of an object to be polished can be more reduced.

The sizes of cationically modified silica (e.g., average primary particle size, average secondary particle size, aspect ratio, and D90/D50) can be appropriately controlled by selection and the like of a method for producing a cationically modified silica.

The lower limit of the zeta potential of the cationically modified silica in the polishing composition is preferably 4 mV or more, more preferably 4.5 mV, and further preferably 5 mV or more. Further, the upper limit of the zeta potential of the cationically modified silica in the polishing composition is preferably 70 mV or less, more preferably 65 mV or less, and further preferably 60 mV or less. Specifically, the zeta potential of abrasive grains in the polishing composition is preferably 4 mV or more and 70 mV or less, more preferably 4.5 mV or more and 65 mV or less, and further preferably 5 mV or more and 60 mV or less.

With the cationically modified silica having the above-described zeta potential, the group 13 element layer can be polished at an even higher polishing speed. In addition, the polishing speed for the group 13 element layer becomes higher than the polishing speed for other materials (selection ratio is more increased).

In this specification, as the zeta potential of the cationically modified silica, a value measured by a method described in Examples is employed. The zeta potential of the cationically modified silica can be adjusted using the amount of cationic groups contained in the cationically modified silica and the pH of the polishing composition, or the like.

The content (concentration) of the cationically modified silica in the polishing composition is not particularly limited, but is preferably 0.1 mass % or more, more preferably 0.2 mass % or more, further preferably 0.5 mass % or more, and particularly preferably more than 0.5 mass % with respect to the total mass of the polishing composition. Further, the upper limit of the content of the cationically modified silica in the polishing composition is preferably 10 mass % or less, more preferably 5 mass % or less, further preferably 4 mass % or less, and particularly preferably less than 4 mass % with respect to the total mass of the polishing composition. Specifically, the content of the cationically modified silica is preferably 0.1 mass % or more and 10 mass % or less, more preferably 0.2 mass % or more and 5 mass % or less, further preferably 0.5 mass % or more and 4 mass % or less, and particularly preferably more than 0.5 mass % and less than 4 mass % with respect to the total mass of the polishing composition.

With the content of the cationically modified silica within such ranges, the group 13 element layer can be polished at an even higher polishing speed. Further, the polishing speed for the group 13 element layer will be higher than the polishing speed for other materials (selection ratio is more increased). When the polishing composition contains two or more cationically modified silicas, the content of the cationically modified silica is intended to be the total amount of these cationically modified silicas.

The polishing composition according to the present invention may further contain other abrasive grains other than the cationically modified silica to such an extent that the effects of the present invention are not impaired. Such other abrasive grains may be any of inorganic particles, organic particles, and organic and inorganic composite particles. Specific examples of the inorganic particles include particles composed of metal oxide such as untreated silica, alumina, ceria, or titania, silicon nitride particles, silicon carbide particles, and boron nitride particles. Specific examples of the organic particles include methyl polymethacrylate (PMMA) particles. Such other abrasive grains may be used singly or in a mixture of two or more thereof. Further, commercial products or synthetic products of such other abrasive grains may also be used.

[Polyalkylene Glycol]

The polishing composition according to the present invention contains a polyalkylene glycol. A polyalkylene glycol has an action of accelerating (improving polishing speed) the polishing of the group 13 element layer. One polyalkylene glycol may be used, or two or more thereof may be used in combination. Further, commercial products of polyalkylene glycol may be used and synthetic products thereof may also be used.

Examples of the polyalkylene glycol include, but are not particularly limited to, polyethylene glycol, polypropylene glycol, polytetramethylene glycol, polyethylene glycol-polypropylene glycol random copolymer, polyethylene glycol-polytetramethylene glycol random copolymer, polypropylene glycol-polytetramethylene glycol random copolymer, polyethylene glycol-polypropylene glycol-polytetramethylene glycol random copolymer, polyethylene glycol-polypropylene glycol block copolymer, polypropylene glycol-polyethylene glycol-polypropylene glycol triblock copolymer, and polyethylene glycol-polypropylene glycol-polyethylene glycol triblock copolymer. Of these, the polyalkylene glycol is preferably polyethylene glycol or polypropylene glycol, and more preferably polyethylene glycol.

The weight average molecular weight (Mw) of the polyalkylene glycol is preferably 100 or more, more preferably 150 or more, and further preferably 200 or more. Further, the weight average molecular weight (Mw) of the polyalkylene glycol is preferably 30,000 or less, more preferably 10,000 or less, and further preferably 1,000 or less. Specifically, the weight average molecular weight (Mw) of the polyalkylene glycol is preferably 100 or more and 30,000 or less, more preferably 150 or more and 10,000 or less, further preferably 150 or more and 1,000 or less, particularly preferably 200 or more and 1,000 or less, and most preferably 200 or more and 350 or less.

Note that in this specification, the weight average molecular weight of the polyalkylene glycol can be measured by gel permeation chromatography (GPC) using polyethylene glycol as a reference material. The detailed measurement method is as described in Examples.

The content (concentration) of the polyalkylene glycol in the polishing composition is not particularly limited, but is preferably 0.001 mass % or more, more preferably 0.01 mass % or more, and further preferably 0.03 mass % or more with respect to the total mass of the polishing composition. Further, the content of the polyalkylene glycol in the polishing composition is preferably 10 mass % or less, more preferably 5 mass % or less, further preferably 1 mass % or less, particularly preferably 0.2 mass % or less, and most preferably 0.15 mass % or less with respect to the total mass of the polishing composition. Specifically, the content of the polyalkylene glycol is preferably 0.001 mass % or more and 10 mass % or less, more preferably 0.01 mass % or more and 5 mass % or less, further preferably 0.03 mass % or more and 1 mass % or less, particularly preferably 0.03 mass % or more and 0.2 mass % or less, and most preferably 0.03 mass % or more and 0.15 mass % or less. With the content of the polyalkylene glycol within such ranges, the group 13 element layer can be polished at an even higher polishing speed. Further, the polishing speed for the group 13 element layer will be higher than the polishing speed for other materials (selection ratio is more increased).

[Acid]

The polishing composition according to the present invention contains an acid. Examples of the acid include carboxylic acid such as formic acid, acetic acid, propionic acid, butyric acid, 2-hydroxyisobutyric acid (HBA), valeric acid, caproic acid, enanthic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, fumaric acid, maleic acid, aconitic acid, amino acid, anthranilic acid, and nitrocarboxylic acid; sulfonic acid such as methanesulfonic acid, ethanesulfonic acid, benzenesulfonic acid, p-toluenesulfonic acid, 10-camphorsulphonic acid, isethionic acid, and taurine; and inorganic acid such as carbonic acid, hydrochloric acid, nitric acid, phosphoric acid, hypophosphorous acid, phosphorous acid, phosphoric acid, sulfuric acid, boric acid, hydrofluoric acid, orthophosphoric acid, pyrophosphoric acid, polyphosphoric acid, metaphosphoric acid, and hexametaphosphoric acid. These acids may be used singly or in combinations of two or more thereof.

Of these, from the viewpoint of further improving the effects of the present invention, the above acid is preferably at least one selected from the group consisting of an acid having a nitric acid group and an acid having a sulfonic acid group. The acid having a nitric acid group is more preferably nitric acid. The acid having a sulfonic acid group is more preferably 10-camphorsulfonic acid or isethionic acid.

The content (concentration) of the acid in the polishing composition is not particularly limited, but is preferably 0.001 mass % or more, and more preferably 0.005 mass % or more with respect to the total mass of the polishing composition. Further, the content of the acid in the polishing composition is preferably 10 mass % or less, and more preferably 5 mass % or less with respect to the total mass of the polishing composition. With the acid content within such ranges, the group 13 element layer can be polished at an even higher polishing speed. Further, the polishing speed for the group 13 element layer will be higher than the polishing speed for other materials (selection ratio is more increased).

[Dispersing Medium]

The polishing composition according to the present invention preferably contains a dispersing medium for dispersing each component. Examples of the dispersing medium can include water, alcohols such as methanol, ethanol, and ethylene glycol, ketones such as acetone, and mixtures thereof. Of these, water is preferable as a dispersing medium. Specifically, according to a preferred embodiment of the present invention, examples of a dispersing medium include water. According to a more preferred embodiment of the present invention, the dispersing medium is substantially composed of water. Note that the above "substantially" is intended to mean that a dispersing medium other than water can be contained as long as the effects of the present invention can be achieved. More specifically, the dispersing medium is composed of preferably 90 mass % or more and 100 mass % or less of water and 0 mass % or more and 10 mass % or less of a dispersing medium other than water, and more preferably 99 mass % or more and 100 mass % or less of water and 0 mass % or more and 1 mass % or less of a dispersing medium other than water. Most preferably, the dispersing medium is water.

Water with as little impurities as possible is preferable as the dispersing medium from the viewpoint of not inhibiting the action of components contained in the polishing composition. Specifically, pure water or ultra-pure water, which is obtained by removing foreign matter through a filter after removal of impurity ions using an ion exchange resin, or distilled water is more preferable.

[pH]

The pH of the polishing composition according to the present invention is preferably 1 or more, and more preferably 2 or more. Further, the pH is preferably less than 6, and more preferably 5 or less. Specifically, the pH of the polishing composition according to the present invention is preferably 1 or more and less than 6, more preferably 2 or more and 5 or less, further preferably 2 or more and 4 or less, and particularly preferably 2 or more and less than 4.

Note that the pH of the polishing composition can be obtained by performing 3-point calibration using a pH meter (for example, a glass electrode hydrogen ion concentration indicator (Model No.: F-23) manufactured by HORIBA, Ltd.) and standard buffers (phthalate pH buffer pH: 4.01 (25° C.), neutral phosphate pH buffer pH: 6.86 (25° C.), carbonate pH buffer pH: 10.01 (25° C.)), placing the glass electrode in the polishing composition, and then measuring the value stabilized after 2 or more minutes.

The polishing composition according to the present invention contains abrasive grains, a polyalkylene glycol, and an acid as essential components. However, when it is difficult to obtain a desired pH with these components alone, a pH adjusting agent may be added to adjust the pH to such an extent that the effects of the present invention are not impaired.

The pH adjusting agent is preferably a base, and may be any of an inorganic compound and an organic compound. One pH adjusting agent can be used, or two or more thereof may be used in a mixture.

Specific examples of a base that can be used as the pH adjusting agent include, a hydroxide of a group 1 element or a salt thereof, a hydroxide of a group 2 element or a salt, a quaternary ammonium hydroxide or a salt thereof, and amine. Specific examples of salts include carbonate, hydrogen carbonate, sulfate, and acetate.

The amount of the pH adjusting agent added is not particularly limited and may be adequately adjusted so that the polishing composition has a desired pH.

[Other Components]

The polishing composition according to the present invention may further contain a known additive such as an oxidizing agent, a complexing agent, an antiseptic agent, and an antifungal agent, which can be used for the polishing composition, to such an extent that the effects of the present invention are not impaired.

[Method for Producing Polishing Composition]

A method for producing the polishing composition according to the present invention is not particularly limited. For example, the polishing composition can be obtained by mixing and stirring a cationically modified silica, a polyalkylene glycol, acid, and other additives as necessary in a dispersing medium (e.g., water). Each component is as described in detail above.

Temperature at which each component is mixed is not particularly limited, and the temperature is preferably 10° C. or higher and 40° C. or lower, and the mixture may also be heated in order to increase the rate of dissolution. Further the time for mixing is not particularly limited, as long as the mixture can be mixed uniformly.

[Polishing Method and Method for Producing Semiconductor Substrate]

As described above, the polishing composition according to the present invention is suitably used for polishing an object to be polished having a group 13 element layer. Hence, the present invention provides a polishing method for polishing an object to be polished having a layer containing an element in group 13 of the periodic table in a content of 40 mass % or more using the polishing composition according to the present invention. Further, the present invention provides a method for producing a semiconductor substrate, which involves polishing a semiconductor substrate having a layer containing an element in group 13 of the periodic table in a content of 40 mass % or more by the above polishing method.

As a polishing apparatus, it is possible to use a general polishing apparatus including a holder for holding a substrate or the like having an object to be polished, a motor having a changeable rotational speed or the like fitted thereto, and a platen to which a polishing pad (polishing cloth) can be attached.

As the polishing pad, general nonwoven fabric, polyurethane, a porous fluororesin, or the like can be used without any particular limitation. The polishing pad is preferably grooved such that a polishing liquid can be stored therein.

Regarding polishing conditions, for example, the rotational speed of a platen is preferably 10 rpm (0.17 s$^{-1}$) or more and 500 rpm (8.33 s$^{-1}$) or less. The pressure (polishing pressure) applied to a substrate having an object to be polished is preferably 0.5 psi (3.4 kPa) or more and 10 psi (68.9 kPa) or less. A method for feeding the polishing composition to a polishing pad is also not particularly limited. For example, a method for continuously feeding the polishing composition using a pump or the like is employed. The feed rate is not limited, but a surface of the polishing pad is preferably covered all the time with the polishing composition according to the present invention.

After completion of polishing, the substrate is cleaned in running water, water droplets adhered onto the substrate are removed using a spin dryer or the like for drying, and thus the substrate having a metal-containing layer is obtained.

The polishing composition according to the present invention may be of a single-fluid type or multi-fluid type including double-fluid type. Further, the polishing composition according to the present invention may be prepared by, for example, diluting 10 or more times an undiluted solution of the polishing composition using a diluent such as water.

The embodiments of the present invention are described in detail above, but are given for explanatory and illustrative purposes only, and are not limited. The scope of the present invention should be obviously construed on the basis of the attached claims.

The present invention encompasses the following aspects and embodiments.

[1] A polishing composition for use in polishing an object to be polished having a layer having a content of a group 13 element of more than 40 mass %, the polishing composition comprising:
   a cationically modified silica, a polyalkylene glycol, and an acid.

[2] The polishing composition according to [1], wherein the cationically modified silica has an average primary particle size of 5 nm or more and 30 nm or less.

[3] The polishing composition according to [2], wherein a ratio of an average secondary particle size to the average primary particle size of the cationically modified silica (average secondary particle size/average primary particle size) is 1.2 or more and 3 or less.

[4] The polishing composition according to any one of [1] to [3], wherein the cationically modified silica in the polishing composition has a zeta potential of 5 mV or more and 60 mV or less.

[5] The polishing composition according to any one of [1] to [4], wherein the polyalkylene glycol is polyethylene glycol.

[6] The polishing composition according to any one of [1] to [5], wherein the polyalkylene glycol has a weight average molecular weight of 100 or more and 30000 or less.

[7] The polishing composition according to any one of [1] to [6], wherein the acid is at least one selected from the group consisting of acids having a nitric acid group and acids having a sulfonic acid group.

[8] The polishing composition according to any one of [1] to [7], wherein the polishing composition has a pH of 1 or more and less than 6.

[9] A polishing method, comprising polishing an object to be polished having a layer having a content of a group 13 element of more than 40 mass % using the polishing composition according to any one of [1] to [8].

[10] A method for producing a semiconductor substrate, comprising polishing a semiconductor substrate having a layer having a content of a group 13 element of more than 40 mass % by the polishing method according to [9].

EXAMPLES

The present invention will be described in more detail using the following Examples and Comparative Examples, but the technical scope of the present invention is not limited to only the following Examples. Note that unless otherwise specified, "%" refers to "mass %" and "part(s)" refers to "parts by mass"

<Average Primary Particle Size of Abrasive Grains>

The average primary particle size of abrasive grains was calculated from the specific surface area of silica particles measured by the BET method using "Flow Sorb II 2300" manufactured by Micromeritics and the density of abrasive grains.

<Average Secondary Particle Size of Abrasive Grains>

The average secondary particle size of abrasive grains was measured as volume-mean particle size (arithmetic mean diameter of standard volume; Mv) using a dynamic light scattering particle diameter and particle size distribution apparatus UPA-UTI151 (manufactured by Nikkiso Co., Ltd.).

<Average Degree of Association of Abrasive Grains>

The average degree of association of abrasive grains was calculated by dividing the value of the average secondary particle size of the abrasive grains by the value of the average primary particle size of the abrasive grains.

<Zeta Potential of Abrasive Grains>

The zeta potential of abrasive grains in the polishing composition was calculated by subjecting a polishing composition to measurement by a laser doppler method (electrophoretic light scattering method) using Zetasizer Nano manufactured by Malvern Panalytical Ltd., under conditions of the measurement temperature of 25° C., and then analyzing the thus obtained data with Smoluchowski's formula.

<Weight Average Molecular Weight of Polyalkylene Glycol>

The weight average molecular weight of the polyalkylene glycol was measured by gel permeation chromatography (GPC) using polyethylene glycol as a reference material. Detailed conditions are as follows:

GPC apparatus: manufactured by SHIMADZU CORPORATION
Model: Prominence+ELSD detector (ELSD-LTII)
Column: VP-ODS (manufactured by SHIMADZU CORPORATION)
Mobile phase A: MeOH
   B: acetic acid 1% aqueous solution
Flow rate: 1 mL/min
Detector: ELSD temp. 40° C., Gain 8, N$_2$GAS 350 kPa
Oven temperature: 40° C.
Amount injected: 40 μl.

<pH of Polishing Composition>

Regarding the pH of each polishing composition, 3-point calibration was performed using a glass electrode hydrogen ion concentration indicator (manufactured by HORIBA, Ltd., Model No.: F-23) and standard buffers (phthalate pH buffer pH: 4.01 (25° C.), neutral phosphate pH buffer pH: 6.86 (25° C.), carbonate pH buffer pH: 10.01 (25° C.)), and then the glass electrode was placed in the polishing composition, thereby finding the value stabilized after 2 or more minutes as the pH value.

[Preparation of Polishing Composition]

Example 1

In the manner same as the method described in Example 1 of Japanese Patent Laid-Open No. 2005-162533, γ-aminopropyltriethoxysilane (APTES) was used as a silane coupling agent at the concentration of 2 mmol (2 mM) for 1 L of silica sol (methanol solution, silica concentration=20 mass %), thereby preparing cocoon-shaped cationically modified colloidal silica having an average primary particle size: 24.6 nm, an average secondary particle size: 47.2 nm, an average degree of association: 1.92.

The above-obtained cationically modified colloidal silica as abrasive grains and polyethylene glycol (PEG, manufactured by FUJIFILM Wako Pure Chemical Corporation, weight average molecular weight: 200) as polyalkylene glycol were added to pure water as a dispersing medium so that the final concentrations thereof were 4 mass % and 0.05 mass %, respectively, at room temperature (25° C.), thereby obtaining a mixed solution.

Subsequently, to the mixed solution, nitric acid was added as an acid so that the final concentration was 0.0252 mass %, the solution was stirred and mixed at room temperature (25° C.) for 30 minutes, thereby preparing a polishing composition.

The thus obtained polishing composition had a pH of 2.5. Further, the zeta potential of cationically modified colloidal silica in the obtained polishing composition was measured according to the above method and the result was +27 mV. Moreover, the particle size of cationically modified colloidal silica in the polishing composition was the same as the particle size of the cationically modified colloidal silica used.

Examples 2 to 21, Comparative Examples 1 to 4

Except for changing the particle size and the shape of abrasive grains, the amount of APTES used, the content of abrasive grains, and the type and the content of a polyalkylene glycol, as well as the type and the content of an acid as described in Table 1 below, polishing compositions were prepared in the same manner as in Example 1.

The symbol "-" in Table 1 below indicates that the relevant agent was not used. Comparative Examples 1 and 2 are examples wherein an untreated colloidal silica was used and a polyalkylene glycol was not used. Comparative Example 4 is an example wherein a polyalkylene glycol was not used.

The composition of each polishing composition is as shown in Table 1 below.

TABLE 1

| | Abrasive grains | | | | | | | Polyalkylene glycol | | | Acid | | Polishing |
|---|---|---|---|---|---|---|---|---|---|---|---|---|---|
| | Average primary particle size (nm) | Average secondary particle size (nm) | Average degree of association | Shape | Amount of APTES used (mM) | Zeta potential (mV) | Content (mass %) | Type | Mw | Content (mass %) | Type | Content (mass %) | composition pH |
| Example 1 | 24.6 | 47.2 | 1.92 | Cocoon | 2.0 | +27 | 4.0 | PEG | 200 | 0.25 | Nitric acid | 0.0252 | 2.5 |
| Example 2 | 33.3 | 52.0 | 1.56 | Spherical | 2.0 | +30 | 1.0 | PEG | 200 | 0.25 | Nitric acid | 0.0280 | 2.5 |
| Example 3 | 33.3 | 52.0 | 1.56 | Spherical | 2.0 | +30 | 4.0 | PEG | 200 | 0.25 | Nitric acid | 0.0320 | 2.5 |
| Example 4 | 76.3 | 120.0 | 1.57 | Cocoon | 1.7 | +53 | 4.0 | PEG | 200 | 0.25 | Nitric acid | 0.0252 | 2.5 |
| Example 5 | 17.0 | 27.0 | 1.59 | Spherical | 2.0 | +22 | 1.0 | PEG | 200 | 0.25 | Acetic acid | 3.3150 | 2.5 |
| Example 6 | 15.0 | 35.0 | 2.33 | Cocoon | 1.3 | +19 | 1.0 | PEG | 200 | 0.25 | Isethionic acid | 0.0520 | 2.5 |
| Example 7 | 24.6 | 47.2 | 1.92 | Cocoon | 2.0 | +27 | 1.0 | PEG | 200 | 0.25 | Nitric acid | 0.0252 | 2.5 |
| Example 8 | 24.6 | 47.2 | 1.92 | Cocoon | 2.0 | +27 | 1.0 | PEG | 200 | 0.25 | Isethionic acid | 0.0520 | 2.5 |
| Example 9 | 17.0 | 27.0 | 1.59 | Spherical | 2.0 | +22 | 1.0 | PEG | 200 | 0.25 | Nitric acid | 0.0258 | 2.5 |
| Example 10 | 17.0 | 27.0 | 1.59 | Spherical | 2.0 | +22 | 1.0 | PEG | 200 | 0.25 | Isethionic acid | 0.0520 | 2.5 |
| Example 11 | 17.0 | 27.0 | 1.59 | Spherical | 2.0 | +22 | 4.0 | PEG | 200 | 0.25 | Isethionic acid | 0.0520 | 2.5 |
| Example 12 | 17.0 | 27.0 | 1.59 | Spherical | 2.0 | +22 | 1.0 | PEG | 200 | 0.25 | 2-hydroxy-isobutyric acid | 2.8960 | 2.5 |
| Example 13 | 17.0 | 27.0 | 1.59 | Spherical | 2.0 | +22 | 1.0 | PEG | 200 | 0.25 | 10-camphor-sulfonic acid | 0.1190 | 2.5 |
| Example 14 | 17.0 | 27.0 | 1.59 | Spherical | 2.0 | +20 | 1.0 | PEG | 200 | 0.25 | Isethionic acid | 0.0220 | 3.0 |
| Example 15 | 17.0 | 27.0 | 1.59 | Spherical | 2.0 | +19 | 1.0 | PEG | 200 | 0.25 | Isethionic acid | 0.0150 | 4.0 |
| Example 16 | 17.0 | 27.0 | 1.59 | Spherical | 2.0 | +10 | 1.0 | PEG | 200 | 0.25 | Isethionic acid | 0.0100 | 5.0 |
| Example 17 | 17.0 | 27.0 | 1.59 | Spherical | 2.0 | +22 | 1.0 | PEG | 200 | 0.10 | Isethionic acid | 0.0520 | 2.5 |
| Example 18 | 17.0 | 27.0 | 1.59 | Spherical | 2.0 | +22 | 1.0 | PEG | 200 | 0.03 | Isethionic acid | 0.0520 | 2.5 |
| Example 19 | 17.0 | 27.0 | 1.59 | Spherical | 2.0 | +22 | 1.0 | PEG | 600 | 0.10 | Isethionic acid | 0.0520 | 2.5 |
| Example 20 | 17.0 | 27.0 | 1.59 | Spherical | 2.0 | +22 | 1.0 | PEG | 2000 | 0.10 | Isethionic acid | 0.0520 | 2.5 |
| Example 21 | 17.0 | 27.0 | 1.59 | Spherical | 3.0 | +23 | 1.0 | PEG | 400 | 0.10 | Isethionic acid | 0.0520 | 2.5 |
| Comparative Example 1 | 17.0 | 27.0 | 1.59 | Spherical | — | +1 | 1.0 | — | — | — | Nitric acid | 0.0300 | 2.5 |
| Comparative Example 2 | 24.6 | 47.2 | 1.92 | Cocoon | — | +3 | 1.0 | — | — | — | Nitric acid | 0.0260 | 2.5 |
| Comparative Example 3 | 17.0 | 27.0 | 1.59 | Spherical | 2.0 | −57 | 1.0 | PEG | 200 | 0.25 | NH$_4$OH | 0.2020 | 10.0 |
| Comparative Example 4 | 76.3 | 120.0 | 1.57 | Cocoon | 1.7 | +53 | 4.0 | — | — | — | Nitric acid | 0.0252 | 2.5 |

EVALUATION

The surface of each object to be polished was polished using each of the polishing compositions prepared above under the following conditions. As objects to be polished, a silicon wafer (300 mm, blanket wafter; manufactured by ADVANTEC CO., LTD.) having a 5000 Å thick boron (B)-silicon (Si) film (boron (B) content 50 mass %: silicon (Si) content 50 mass %) formed on a surface, a silicon wafer (300 mm, blanket wafter; manufactured by ADVANTEC CO., LTD.) having a 2500 Å thick SiN (silicon nitride) film formed thereon, and a silicon wafer (300 mm, blanket wafter; manufactured by Advanced Materials Technology, INC.) having a 3600 Å thick TiN (titanium nitride) film formed thereon were prepared:
(Polishing Apparatus and Polishing Conditions)

Polishing apparatus: manufactured by Ebara Corporation 300-mm CMP single-sided polisher FREX300E Polishing pad: manufactured by FUJIBO HOLDINGS. INC. nonwoven fabric pad H800

Polishing pressure: 3.0 psi (1 psi=6894.76 Pa)
Rotational speed of platen: 90 rpm
Rotational speed of carrier: 91 rpm
Feed of polishing composition: free flowing
Feed rate of polishing composition: 250 ml/minute
Polishing time: 60 seconds (Polishing Speed)

The thickness of the B—Si film and the same of the SiN film were measured before and after polishing using an optical film thickness measurement system (ASET-f5x: manufactured by KLA-Tencor Ltd.). The thickness of the TiN film was measured before and after polishing using a sheet resistance measurement system (VR-120: manufactured by Kokusai Electric Semiconductor Service Inc.). With the use of the thus found thicknesses, specifically, each value found by [(thickness before polishing)–(thickness after polishing)] was divided by the polishing time, thereby calculating the polishing speed for each object to be polished.

(Polishing Speed Selection Ratio)

With the use of the following formula, the selection ratios of the polishing speeds were each found:

B—Si/SiN=B—Si polishing speed (Å/min)/SiN polishing speed (Å/min)

B—Si/TiN=B—Si polishing speed (Å/min)/TiN polishing speed (Å/min).

The above evaluation results are shown in Table 2 below.

TABLE 2

|  | Polishing speed (Å/min) | | | Polishing speed Selection ratio | |
| --- | --- | --- | --- | --- | --- |
|  | B—Si | SiN | TiN | B—Si/SiN | B—Si/TiN |
| Example 1 | 1607 | 101 | 212 | 15.9 | 7.6 |
| Example 2 | 642 | 17 | 46 | 37.8 | 14.0 |
| Example 3 | 884 | 51 | 110 | 17.3 | 8.0 |
| Example 4 | 500 | 120 | 170 | 4.2 | 2.9 |
| Example 5 | 522 | 11 | 36 | 47.5 | 14.5 |
| Example 6 | 886 | 15 | 44 | 59.1 | 20.1 |
| Example 7 | 1274 | 20 | 79 | 63.7 | 16.1 |
| Example 8 | 1530 | 25 | 66 | 61.2 | 23.2 |
| Example 9 | 805 | 2 | 32 | 402.5 | 25.2 |
| Example 10 | 966 | 3 | 27 | 322 | 35.8 |
| Example 11 | 985 | 31 | 61 | 31.8 | 16.1 |
| Example 12 | 859 | 12 | 32 | 71.6 | 26.8 |
| Example 13 | 844 | 3 | 30 | 281.3 | 28.1 |
| Example 14 | 911 | 2 | 22 | 455.5 | 41.4 |
| Example 15 | 845 | 2 | 91 | 422.5 | 9.3 |
| Example 16 | 761 | 4 | 55 | 190.3 | 13.8 |
| Example 17 | 1106 | 2 | 23 | 553.0 | 48.1 |
| Example 18 | 1461 | 2 | 23 | 730.5 | 63.5 |
| Example 19 | 722 | 18 | 63 | 40.1 | 11.5 |
| Example 20 | 610 | 13 | 21 | 46.9 | 29.0 |
| Example 21 | 500 | 29 | 26 | 17.2 | 19.2 |
| Comparative Example 1 | 100 | 1 | — | 100.0 | — |
| Comparative Example 2 | 79 | 3 | — | 26.3 | — |
| Comparative Example 3 | 21 | 2 | 13 | 21.0 | 1.6 |
| Comparative Example 4 | 456 | 117 | 155 | 3.9 | 2.9 |

As is clear from Table 2 above, the polishing compositions of Examples further improve the polishing speed for the B—Si film compared with the polishing compositions of Comparative Examples. Further, the polishing compositions of Examples were found to increase the ratio (selection ratio) of the polishing speed for the B—Si film to the polishing speed for other materials compared with the polishing compositions of Comparative Examples.

The present application is based on the Japanese patent application No. 2021-45750 filed on Mar. 19, 2021, and the disclosed content thereof is incorporated herein by reference in their entirety.

The invention claimed is:

1. A polishing composition for use in polishing an object to be polished having a layer containing an element in group 13 of the periodic table in a content of 40 mass % or more, the polishing composition comprising:
   a cationically modified silica, wherein a ratio of an average secondary particle size to an average primary particle size of the cationically modified silica (average secondary particle size/average primary particle size) is 1.2 or more and 3 or less;
   a polyalkylene glycol; and
   an acid,
   wherein the polishing composition has a pH of 1 or more and less than 6.

2. The polishing composition according to claim 1, wherein the average primary particle size of the cationically modified silica is 5 nm or more and 30 nm or less.

3. The polishing composition according to claim 1, wherein the cationically modified silica in the polishing composition has a zeta potential of 5 mV or more and 60 mV or less.

4. The polishing composition according to claim 1, wherein the polyalkylene glycol is polyethylene glycol.

5. The polishing composition according to claim 1, wherein the polyalkylene glycol has a weight average molecular weight of 100 or more and 30,000 or less.

6. The polishing composition according to claim 1, wherein the acid is at least one selected from the group consisting of acids having a nitric acid group and acids having a sulfonic acid group.

7. A polishing method, comprising polishing an object to be polished having a layer containing an element in group 13 of the periodic table in a content of 40 mass % or more using the polishing composition according to claim 1.

8. A method for producing a semiconductor substrate, comprising polishing a semiconductor substrate having a layer containing an element in group 13 of the periodic table in a content of 40 mass % or more by the polishing method according to claim 7.

9. The polishing composition according to claim 1, wherein a ratio D90/D50 of the cationically modified silica is 1.1 or more and 2.0 or less, wherein the D90 and the D50 are determined by a laser diffraction/scattering method.

10. A polishing method, comprising:
polishing an object to be polished having a layer containing an element in group 13 of the periodic table in a content of 40 mass % or more using a polishing composition comprising:
a cationically modified silica;
a polyalkylene glycol having a weight average molecular weight of 100 or more and 30,000 or less; and
an acid,
wherein the polishing composition has a pH of 1 or more and less than 6.

11. A method for producing a semiconductor substrate, comprising polishing a semiconductor substrate having a layer containing an element in group 13 of the periodic table in a content of 40 mass % or more by the polishing method according to claim 10.

12. A polishing composition for use in polishing an object to be polished having a layer containing an element in group 13 of the periodic table in a content of 40 mass % or more, the polishing composition comprising:
a cationically modified silica;
a polyalkylene glycol having a weight average molecular weight of 100 or more and 30,000 or less; and
an acid,
wherein:
the polishing composition has a pH of 1 or more and less than 6; and
a ratio D90/D50 of the cationically modified silica is 1.1 or more and 2.0 or less, wherein the D90 and the D50 are determined by a laser diffraction/scattering method.

* * * * *